United States Patent
Lee

(10) Patent No.: US 6,172,757 B1
(45) Date of Patent: *Jan. 9, 2001

(54) LEVER SENSOR FOR STEPPER FIELD-BY-FIELD FOCUS AND LEVELING SYSTEM

(75) Inventor: Hao-Tien Lee, Taipei (TW)

(73) Assignee: Vanguard International Semiconductor Corporation, Hsin-Chu (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/718,734
(22) Filed: Sep. 25, 1996
(51) Int. Cl.[7] .................................................. G01N 11/00
(52) U.S. Cl. ................................................ 356/399; 356/401
(58) Field of Search .................................. 356/400, 401, 356/363, 399; 250/548; 355/53, 55

(56) References Cited

U.S. PATENT DOCUMENTS

| | | | |
|---|---|---|---|
| 5,121,160 | * 6/1992 | Sano et al. .............................. 355/53 |
| 5,206,496 | * 4/1993 | Clement et al. ........................ 250/271 |
| 5,276,546 | * 1/1994 | Palm et al. ............................. 359/202 |
| 5,283,141 | 2/1994 | Yoon et al. .............................. 430/30 |
| 5,347,226 | 9/1994 | Bachmann et al. .................... 324/724 |
| 5,481,202 | 1/1996 | Frye, Jr. .................................. 324/754 |
| 5,602,400 | * 2/1997 | Kawashima ........................... 356/401 |
| 5,602,620 | * 2/1997 | Miyazaki et al. ..................... 356/401 |

* cited by examiner

Primary Examiner—Robert Kim
(74) Attorney, Agent, or Firm—George O. Saile; Stephen B. Ackerman

(57) ABSTRACT

An apparatus and method are disclosed for sensing horizontally and measuring the level or tilt of features on different locations on a wafer in general, and on chip sites, in particular. This is accomplished on a conventional level sensor, modified and improved, however, according to this invention where a new electrically adjustable, two-directional zoom lens is introduced. The adjustable zoom lens provides field-by-field alignment on a stepper, by providing a variable field view and depth of focus on the viewed field. Thus, whereas prior art provides fixed field-by-field local alignment capability over fixed ship sites on a ware, the present invention extend that capability to variable field-by-field alignment over variable sites on a wafer.

19 Claims, 6 Drawing Sheets

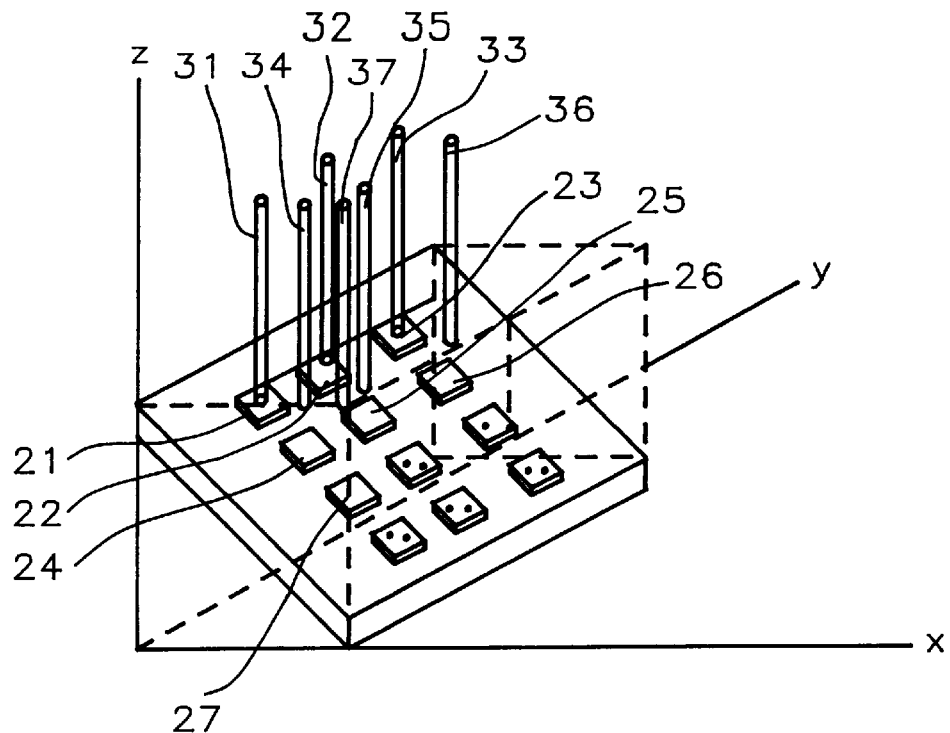
FIG. 1a - Prior Art
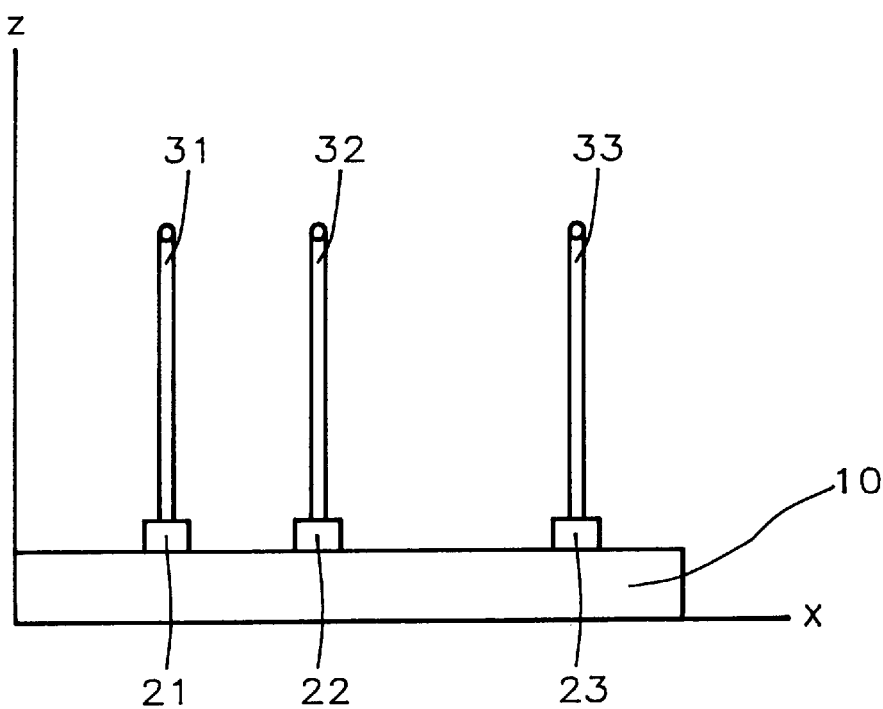
FIG. 1b - Prior Art

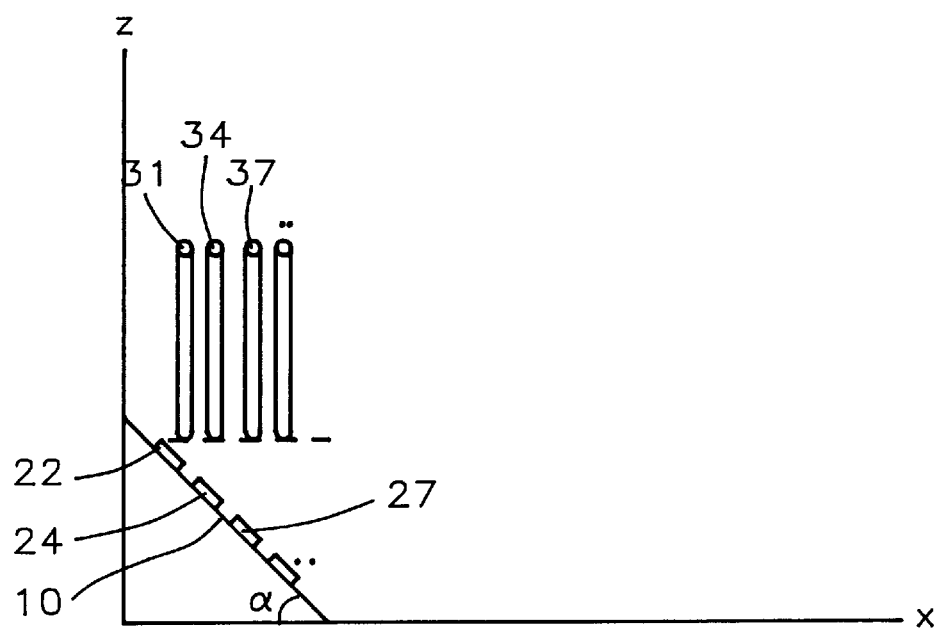
FIG. 1c — Prior Art
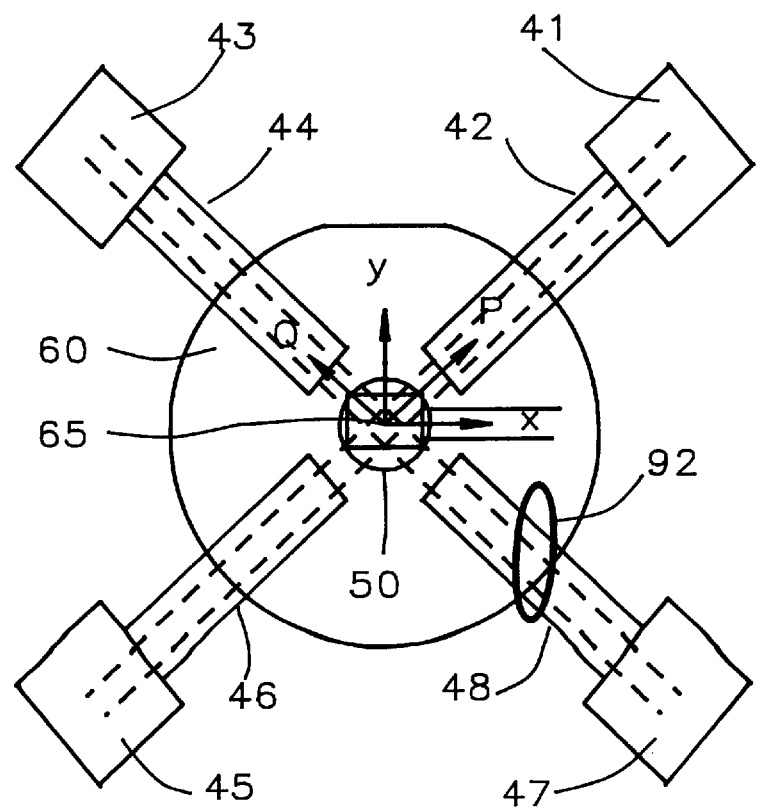
FIG. 2a

LEVER SENSOR FOR STEPPER FIELD-BY-FIELD FOCUS AND LEVELING SYSTEM

BACKGROUND OF THE INVENTION

(1) Field of the Invention

The invention relates generally to processing semiconductor wafers, and in particular, to an apparatus and a method for sensing the level or tilt of wafers on probing stations.

(2) Description of the Related Art

In the manufacture of semiconductor wafers, the latter are probed and tested many times and for many different purposes. Probing usually means contacting or touching a particular object with a probe, or a long and thin implement, such as a wire. In order to touch an object assuredly, it is necessary that that object be secured firmly in place. Thus, in probing wafers, the wafer is first mounted on a chuck or table to hold it in a fixed position. The means for holding the wafer on the table may be accomplished in various ways, of which applying vacuum through holes leading to the table surface is well known in the art. The wafer is so held to the table firmly. The regions or features to be probed on the wafer surface are next aligned with respect to the probing elements before they are actually contacted by the probes. While alignment techniques in prior art have been adequate up until recently, they are found to be more and more wanting with the much finer features of the recent submicron very and ultra large scale integrated (VLSI and ULSI) technologies. This is because of the effect that tilt and the degree of planarity of the object to be probed or tested have on the alignment with respect to the probes. Prior art does not address the problem of tilt as this invention does as disclosed further.

Alignment, that is, correct spatial relationship of the probes with respect to particular features will depend upon the object that is being probed and tested. For example, in probing for dopant profiles in semiconductor structures, the whole wafer is aligned to perform a two-point resistance measurement of the area of interest on the wafer surface following the conventional Spreading Resistance Probe (SRP) method. (See U.S. Pat. No. 5,347,226). On the other hand if probing is performed for electrically testing integrated circuit chips, then the leads of each chip is aligned precisely with respect to the probe elements of the tester as explained in U.S. Pat. No. 5,481,202. In either case, alignment will not be precise unless, in addition to the two-dimensional spatial relationship with respect to the features, the third dimension, namely, the height of probes above the features is also well established.

To show the influence of tilt on probing measurements by way of an example, consider FIGS. 1a–1c of prior art. In FIG. 1a, surface (10) having features (21)–(27) is inclined at an arbitrary angle a in the xz-plane. Probes (31)–(37) in a plane are aligned horizontally above features (21)–(27) as shown in FIG. 1a. Though probes (31), (32) and (33) are aligned in the yz-plane as shown in FIG. 1b, not all the remaining probes, e.g., (34) and (37), See FIG. 1c, reach and contact the corresponding features (24) and (27) due to tilt. In the absence of full contact with all probes, the test results will be erroneous, which in turn, will result in yield loss. In prior art, it is possible to adjust or extend all probes by a certain amount so as to be able to reach those features farthest down on the inclined surface (10). However, it will be appreciated by those skilled in the art that in that case, probes contacting features at higher elevations will be buckled and some, in fact, will be broken because of the contact forces that bear on them. Thus, using this example as a case in point, it is evident that information on tilt as well as the dimensions of the features are important for accurate probing. To accomplish this in the general case where probing is not only limited to probes as shown in FIG. 1a–1c, a better mechanism is needed to be able to view the probing field better, and measure spatial relationships such as tilt in a more reliable manner.

Manual alignment, by human operator using a microscope and manual mechanical adjustments, has been the traditional method used. Usually a visual inspection of the wafer or the chip to be probed is first performed. The scan is typically done optically, with an operator or computer visually checking for any defects. Then the probes are aligned with respect to the features to be probed and tested. Because separate machines are required to accomplish the scanning step and the alignment/testing step, the article to be tested often slips or alters its position slightly before or during testing process. In order to address this problem, U.S. Pat. No. 5,283,141 mentioned above discloses an apparatus in which both the scanning and alignment/testing are accomplished in the same location. However, there is no additional provision for adjusting the probes for vertical alignment.

Automatic alignment methods have also been developed such as for wafer steppers, which require no human intervention. Equipment that perform alignment not for the whole wafer, but only portions thereof, are known in the field as steppers and are mostly used in conducting lithographic processes in the manufacture of integrated circuits (IC). For example, in forming circuits on an IC wafer, circuit patterns are projected through a mask onto a silicon wafer. Because it is impractically complex and expensive to produce a lens capable of projecting a mask over an entire wafer of 100 mm or larger, steppers have been designed to step and repeat across the wafer the pattern field to ve projected. With smaller working area than the whole wafer, therefore, the steppers can provide better alignment and hence better registration of patterns on the wafer surface. Microlithography of the ULSI era of today, however, requires extreme accuracy and precision in the projection of patterns on wafers without any distortion. Distortion can easily be introduced depending upon the particular area on the wafer and also depending upon the unevenness (tilt) with which the wafer is being held on its holder. Even though prior art provides a smaller area to work with the steppers, it has been observed in the present state of the manufacturing of wafers that there is a need to be able to vary further the area under consideration in order to provide improved alignment capability.

Common to different types of alignment including those described above (namely, alignment for dopant profiles in a semiconductor structure, for projecting patterns on a wafer, or for electrical testing of IC chips) is the problem of determining precisely the location of features to be probed. As described earlier in reference to with FIGS. 1a–1c, in addition to the two-dimensional topographical information, a third dimension on the tilt of the features to be probed is also needed. Furthermore, in order to obtain such information at a particular location on the wafer, there is a need for a level sensor with variable area viewing capability. The present invention discloses an improved level sensor apparatus capable of obtaining said information at different areas, including chip sites, on a wafer.

SUMMARY OF THE INVENTION

It is therefore an object of this invention to provide an improved level sensor apparatus for measuring, on wafers, location and tilt (relative to the horizontal) of features in different areas in general, and on chip sites, in particular.

It is another object of this invention to provide an improved level sensor apparatus with an adjustable zoom lens for varying the depth of focus in measuring tilt of features in different areas and on chip sites on wafers.

It is still another object of this invention to provide an improved level sensor apparatus with variable viewing field for measuring location and tilt of features in different areas and on chip sites on wafers.

It is yet another object of this invention to provide an improved method for measuring on wafers location and tilt of features in different areas in general, and on chip sites, in particular.

In accordance with the afore-mentioned objects, there is provided a level sensor apparatus comprising a wafer table to position wafers, a laser measuring system, and a new variable zoom lens.

In accordance with the afore-mentioned objects, there is also provided an improved method for measuring, on wafers, location and tilt of features in different areas in general, and on chip sites, in particular, by providing a level sensor, placing a wafer on a wafer station, and varying the field viewing area to obtain optimum tilt information.

BRIEF DESCRIPTION OF THE DRAWINGS

The objects and features of this invention will become apparent more readily from a reading of the detailed description in conjunction with the drawings that follow:

FIG. 1a is a three-dimensional view showing the spatial relationship between an inclined surface and a system of probes held horizontally in accordance with prior art.

FIG. 1b is a projection on the yz-plane of FIG. 1a of prior art showing probes contacting features.

FIG. 1c is a projection on the xz-plane of FIG. 1a of prior art showing probes that are not contacting features.

FIG. 2a is a plan view showing the alignment of a wafer with respect to the level sensor apparatus of this invention.

FIG. 4a is a schematic drawing showing a field view presented by the adjustable lens of this invention through a laser beam projected on the total area of FIG. 3a.

FIG. 4b is a schematic drawing showing variable field views presented by the adjustable lens of this invention through a laser beam projected onto segmented areas of FIG. 3a.

DESCRIPTION OF THE PREFERRED EMBODIMENTS

Figure 2B:
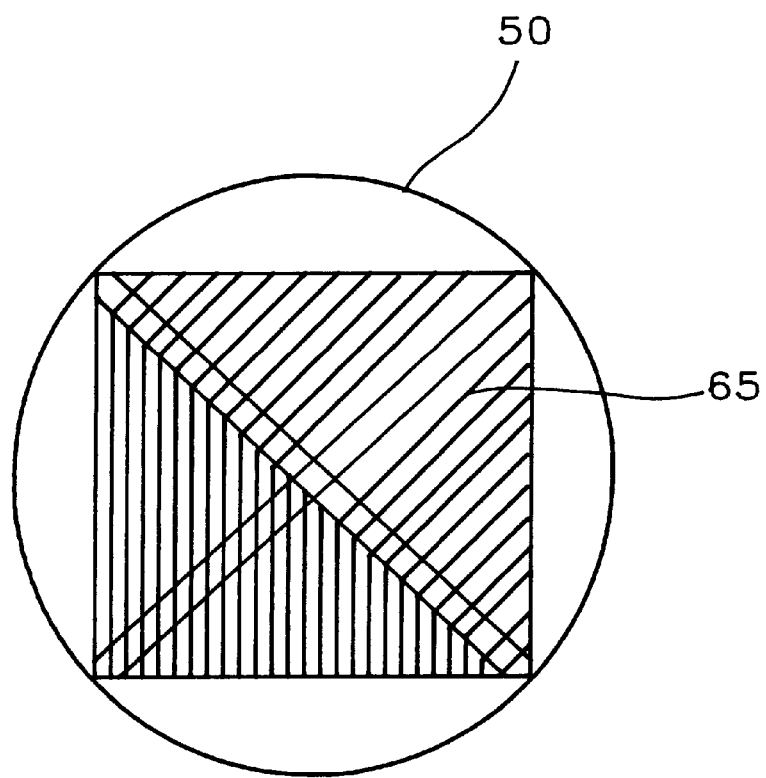
FIG. 2b a plan view showing a chip site in a field view according to this invention.
Figure 2C:
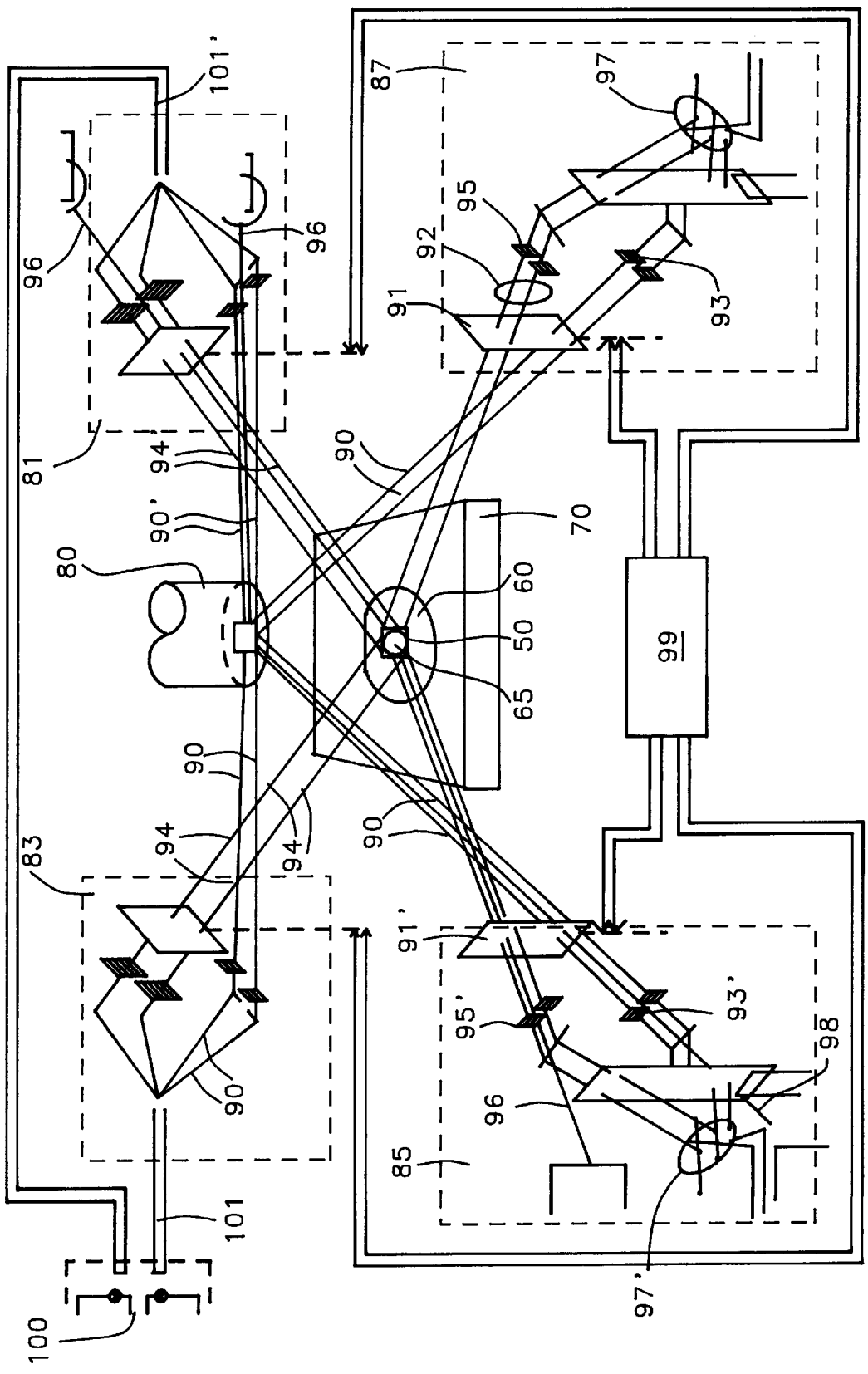
FIG. 2c is a schematic showing a laser interferometric measuring system in conjunction with a image projection system used in level sensor apparatus utilizing an adjustable zoom lens according to this invention.

Referring now to the drawings, there is shown in FIG. 2a a plan view of a level sensor system having four probe housings (41), (43), (45) and (47) with corresponding arms (42), (44), (46) and (48) positioned over chip site (65) on wafer (60). Wafer (60) is held on a movable table or stage (70) shown in FIG. 2c. The stage is capable of moving in x-y direction as indicated in plan view of FIG. 2a. As is commonly employed in aligning wafers, a laser interferometer system shown schematically in the same FIG. 2c is made an integral part of the level sensor system. Components (81), (83), (85) and (87) of the laser system in FIG. 2c are housed in (41), (43), (45) and (47) of FIG. 2a, respectively. A projection lens (80) is provided over wafer (60), which illuminates field (50) shown in FIG. 2a. A better view of field (50) and chip site (65) are shown in FIG. 2b. Employing techniques well known in the art of lithography, a mask pattern (not shown) with fiducial marks is projected on to an area of interest ,such as a chip site, on wafer (60). The fiducial marks are made to coincide with alignment marks on chip site by moving table (70) in x-y direction. The alignment marks, which are not shown, consist of two rectangular patterns, each set at 45° C. angle to the directions of the stage motion and are prefabricated on wafer (60). Thus, alignment marks are oriented in P-Q directions indicated in FIG. 2a, and therefore along the axes of arms (42) and (44). The superimposed fiducial and alignment marks are then reflected back into the optical elements of the laser system. From the interference pattern, a signal is received when alignment of the marks is achieved. Once alignment is accomplished, information on the average height of surface topography and tilt are extracted from interference data collected by moving the wafer under the laser beam and focusing the beam to preselected locations on chip site (65).

Basic aspects of level sensors incorporating laser interferometric systems are well known in the art and as they are not significant to the invention, they are not described in detail here in order not to unnecessarily obscure the present invention. We will note, however, those components which have been improved upon in this invention. As shown in FIG. 2c, conventionally, a reference beam (90) from a light source (100) is directed along paths (42) and (44) to projection lens (80) of level sensor in FIG. 2a by means of optical fibers (101) and (101'), respectively. Said reference beams then travel along paths (48) and (46) of said level sensor as seen in FIG. 2c in correspondence to FIG. 2a. In so doing, the reference beams pass through a pair of reference plane plates (91) and (91'), respectively. Said beams continue, respectively, through a pair of reference gratings (93) and (93') and are registered on quad cells (97) and (97'), as known in the art.

Simultaneously with said reference beams, split "measure beams" (94) and (94') from fibers (101) and (101'), respectively, are directed directly at chip site (65), passing next through said reference plates and then through gratings (95) and (95'), respectively, before reaching quad cells (97) and (97'). The information on the quad cells are read by means of interference patterns formed by a separate reference laser beam (98) and a separate measuring laser beam (96) and coupled with said light beams of reference (90') and of measurement (94'), respectively, as shown in FIG. 2c. For completeness, it is shown in FIG. 2c that the various signals from components (81),(83), (85) and (87) are fed into analyzer (99) for analysis.

Figure 3A:
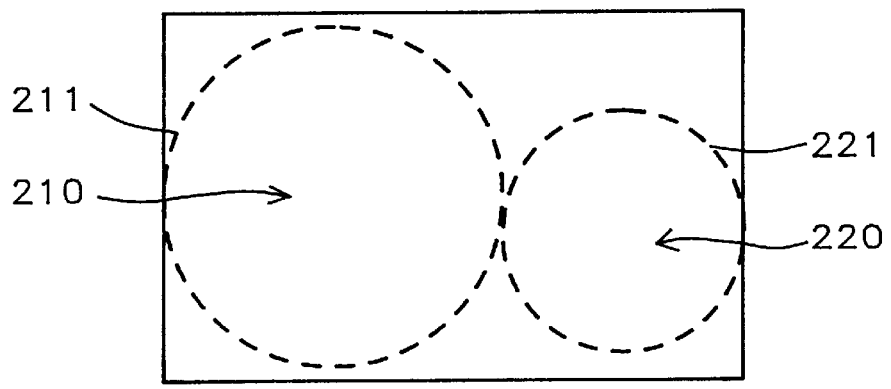
FIG. 3a is a plan view showing a chip with two regions of different topography according to this invention.
Figure 3B:
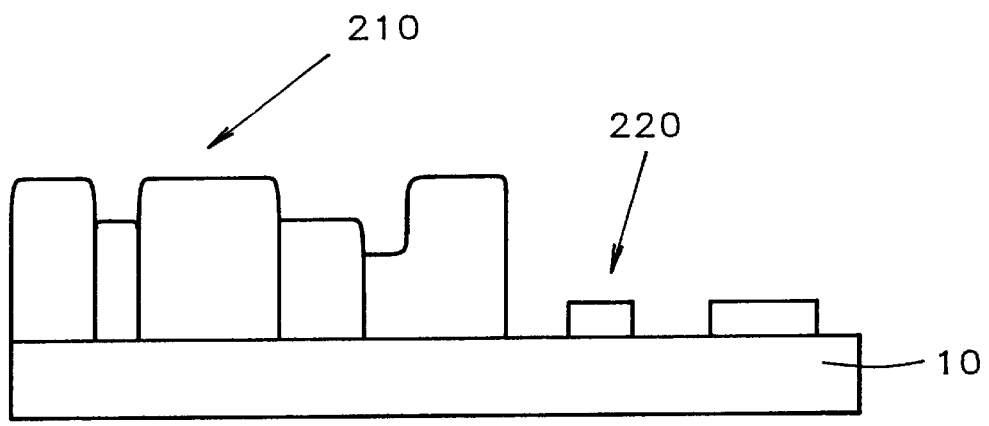
FIG. 3b is a cross section showing the elevational view of features on chip of FIG. 3a of this invention.

In the level sensor apparatus of prior art, field of view (50) shown in FIGS. 2a–2c is fixed for each wafer probed. It will be appreciated by those skilled in the art that a means to vary the field size will remove the attendant disadvantages thereof for the following reasons: In FIG. 3a is shown a plan view of wafer (200) having fields (210) and (220) of different lateral dimensions. The vertical dimensions within those fields are also different as depicted in FIG. 3b. As will be recognized by workers in the field, these different regions can, for example, represent embedded dynamic or static random access memory (DRAM or SRAM) cells along with peripheral circuits in a central processor unit (CPU) chip. That is, features in each field have different dimensions both laterally and vertically. Now, it is apparent that the vertical dimension of each region can best be characterized by the level sensor of FIG. 2a, provided that the field view of the sensor can be varied so as to delimit each region within its own boundaries and not overlap into the neighboring region. Such non-overlapping regions are depicted by broken lines (211) and (221) in FIG. 3a. In prior art, there is no provision provided to vary the field view, and hence the laser interferometric measurement will yield an average height for the region that will be at large variance from the average height of regions with higher elevations, and similarly at large variance from the average height of regions with lower elevations. Consequently, any process that wafer (60) is later subjected to on the basis of average height of features will result in yield loss.

In order to alleviate the aforementioned yield problem, a main feature and key spirit of the present invention is an added electrically adjustable zoom lens (92) next to grating (95) shown in FIG. 2c. With the new adjustable zoom lens (92), it is now possible to adjust field view in situ on the same wafer, and focus on features of similar dimensions and obtain correct depth of focus in different regions with said level sensor. In other words, the zoom lens moves in a three dimensional mode, one in the axial, two, in the lateral x-y directions, and in addition, the diameter of the beam is varied to move over the field of view in situ while the zoom lens is in the same last moved location on the same wafer.

Figure 4A:
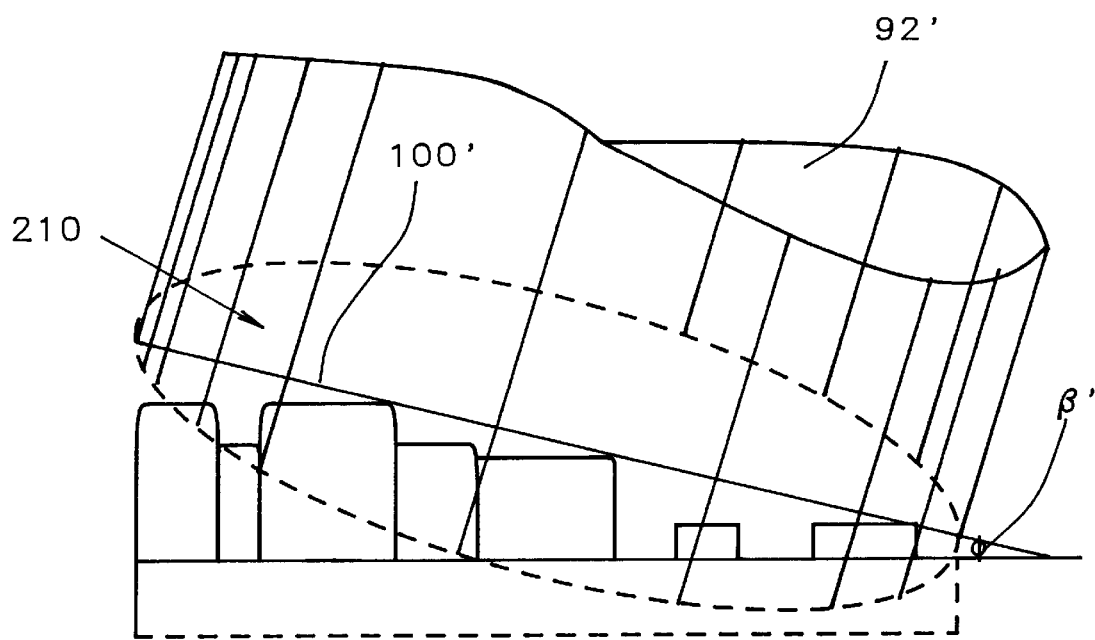
Figure 4B:
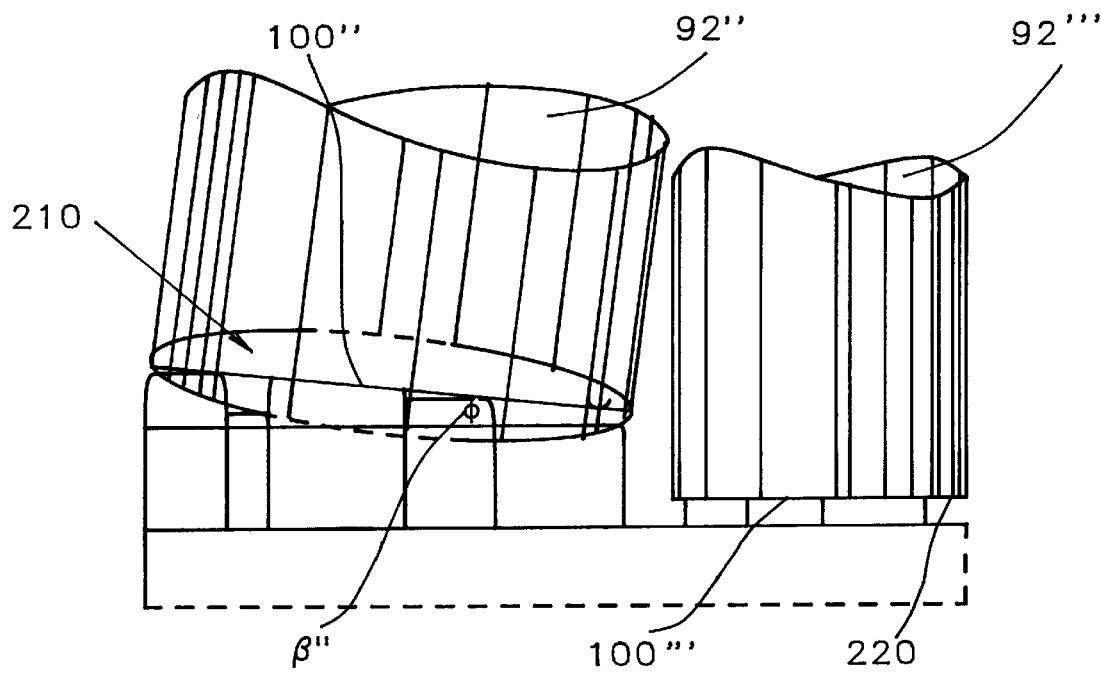

The variable field views presented by the adjustable lens (92) are depicted from adjustable laser beams (92'), (92") and (92'") shown in FIGS. 4a and 4b. First, it will be observed in general that when a beam is directed on a surface, a plane normal to the direction of the beam will form an angle of β with respect to the tilt angle of the surface onto which it is being directed. The adjustable lens disclosed here provides adjustment along the axis of the beam to adjust for the proper depth of focus of the area that is being viewed, and in addition, an adjustment lateral to that axis along the normal plane for the purposes of varying the width of the plane, or the diameter of the beam over the field of view.

In FIG. 4a, laser beam 92' is directed on a surface comprised of regions (210) and (220) of FIG. 3a. An imaginary plane containing typical high points of features in regions (210) and (220) would be inclined at an angle of β' with respect to the horizontal. If the value of β' so measured is larger than a predetermined value β", than the beam diameter 100' shown in FIG. 4a can be varied by means of the adjustable lens (92) of FIG. 2c until an area of an acceptable effective tilt β" is found. This may, for example, be the area (210) shown in FIG. 3a corresponding to a beam diameter of 100" of FIG. 4b. Beam 92'" of diameter 100'" shown also in FIG. 4b is schematically drawn to depict close to zero or no tilt in area (220) inasmuch as the features in that area are of equal height as shown in FIG. 3b. However, it will be appreciated that any additional spatial nonplanarity that any given chip site may have will be compounded onto tilt β', and will be taken into account. In this manner, the filed view can be made to fit the area over which probing is performed, and thereby reduce erroneous results and concomitant yield loss.

It is disclosed, therefore, that with the preferred combination of an electrically adjustable zoom lens for varying both the depth of focus and the field view, that is, with a two-directional adjustable lens, not only can the field be varied to fit the topography to be viewed, but also the depth of focus can determined accurately. Thus, in comparison with prior art methods, a much improved alignment of the probe with the local area to be probed is achieved. Furthermore, with the variable field size, it is now possible to experiment over the entire wafer surface to find the best focus area that represents an optimum depth that should be used to cover the wafer in the next process, say, photoresist application. Finally, whereas prior art provides fixed field-to-field local alignment capability over fixed chip sites on a wafer, the present invention extends that capability to variable field-to-field alignment over variable sites on a wafer.

While the invention has been particularly shown and described with reference to the preferred embodiments thereof, it will be understood by those skilled in the art that various changes in form and details may be made without departing from the spirit and scope of the invention.

What is claimed is:

1. A wafer level sensor apparatus comprising:
   providing a wafer stepper having a centrally located wafer holder, or stage;
   a laser interferometer system having four probe arms reaching over said wafer holder;
   a means to align said wafer holder;
   an overhead image projection system disposed over said wafer holder;
   a laser measurement analyzer system connected to said probe arms;
   an in-situ adjustable zoom lens in each of said probe arms with a three-dimensional mode, wherein said three-dimensional mode comprises a movement along the axial axis of said zoom lens coinciding with the axis of said probe arm, another movement along a lateral axis over said wafer, and still another movement about said axial axis to vary the viewing field over said wafer; and
   a means to vary said zoom lens.

2. The apparatus of claim 1, wherein said means to align said wafer stepper is a vernier.

3. The apparatus of claim 1, wherein said image projection system comprises projection lens, gratings, reference plates.

4. The apparatus of claim 1, wherein one direction of said three-dimensional mode is along the axis of said zoom lens.

5. The apparatus of claim 1, wherein the other direction of said three-dimensional mode is in the plane of said wafer perpendicular to the axis of said zoom lens.

6. The apparatus of claim 1, wherein said means to adjust said zoom lens is accomplished electrically.

7. A method for sensing horizontally the level of wafers comprising the steps of:
   providing a wafer stepper;
   placing a wafer on said wafer stepper;
   projecting a pattern image on said wafer;
   aligning said wafer;
   illuminating a viewing field on said wafer;
   providing an adjustable zoom lens;
   adjusting said zoom lens;
   varying the size of said viewing field, wherein said varying of the viewing field is accomplished by adjusting a laser beam in a lateral direction perpendicular to the axis of the said zoom lens;
   focusing on said viewing field;
   measuring tilt; said
   measuring height of features on said field.

8. The method of claim 7, wherein said stepper is a table with a vernier.

9. The method of claim 7, wherein said wafer has alignment marks thereon.

10. The method of claim 7, wherein projection of said pattern image on said wafer is accomplished by means of a projection lens.

11. The method of claim 7, wherein said aligning of said wafer is accomplished by superimposing said alignment marks on said pattern image.

12. The method of claim 7, wherein said illuminating a viewing field is accomplished by means of a projection lens.

13. The method of claim 12, wherein said illumination is accomplished by means of a laser beam.

14. The method of claim 7, wherein said adjusting of said zoom lens is accomplished through electrical means.

15. The method of claim 7 or claim 13, wherein said varying of the viewing field is accomplished by adjusting said laser beam in a lateral direction parpendicular to the axis of said zoom lens.

16. The method of claim 7, wherein said focusing is accomplished by adjusting said zoom lens in the axial direction.

17. The method of claim 7, wherein said measuring of tilt is accomplished by said three-dimensionally adjustable zoom lens.

18. The method of claim 7, wherein said measuring of height of features is accomplished by focusing said adjustable zoom lens.

19. The apparatus of claim 5, wherein said zoom lens is adjustable to vary the size of the viewing field on said wafer.

* * * * *